US006819128B2

(12) United States Patent
Hisaishi et al.

(10) Patent No.: US 6,819,128 B2
(45) Date of Patent: Nov. 16, 2004

(54) LATCH LOCKING MECHANISM OF A KGD CARRIER

(75) Inventors: Minoru Hisaishi, Tokyo (JP); Noriyuki Matsuoka, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/290,204

(22) Filed: Nov. 8, 2002

(65) Prior Publication Data

US 2003/0089635 A1 May 15, 2003

(30) Foreign Application Priority Data

Nov. 12, 2001 (JP) ........................................ 2001-346331

(51) Int. Cl.[7] .................... G01R 31/02; B65D 85/00
(52) U.S. Cl. ...................... 324/755; 206/701; 324/765
(58) Field of Search ................................ 324/754, 755, 324/758, 765, 760; 439/266; 206/701, 710, 722, 724

(56) References Cited

U.S. PATENT DOCUMENTS 5,320,550 A  *  6/1994  Uratsuji et al. ............. 439/266
5,557,212 A  *  9/1996  Isaac et al. .................. 324/755
6,046,597 A  *  4/2000  Barabi ........................ 324/755

FOREIGN PATENT DOCUMENTS

| JP | 58-206145 | 12/1983 |
|---|---|---|
| JP | 59-103390 | 7/1984 |
| JP | 9-22764 | 1/1997 |
| JP | 2001-91557 | 4/2001 |
| JP | 2001-228200 | 8/2001 |

* cited by examiner

Primary Examiner—Ernest Karlsen
(74) Attorney, Agent, or Firm—Finnegan, Henderson, Farabow, Garrett & Dunner, LLP

(57) ABSTRACT

A latch locking mechanism of a KGD carrier includes a carrier retaining member having a cover and a chip retaining member, a carrier base assembly having a carrier main body, a substrate, and a carrier base, at least two opposite latches rotationally movably provided on the cover of the carrier retaining member and each including an operation portion and a locking portion which generally form an L shape, and engaging portions provided on the carrier main body of the carrier base assembly to engage with the corresponding locking portions of the latches. When the locking portions of the two opposite latches are closed, the locking portions engage with the corresponding engaging portions provided on the carrier main body to lock the carrier retaining member and the carrier base assembly.

10 Claims, 4 Drawing Sheets

LATCH LOCKING MECHANISM OF A KGD CARRIER

This application is based on Patent Application No. 2001-346331 filed Nov. 12, 2001 in Japan, the content of which is incorporated hereinto by reference.

BACKGROUND OF THE INVENTION

1. Field of the Invention

The present invention relates to a latch locking mechanism of a KGD carrier, and more specifically, to a latch locking mechanism of a KGD carrier which can be easily opened and closed.

2. Description of the Related Art

If a chip (die) which has met a specification but has not been packaged, i.e. a KGD (Known Good Die) is to be subjected to a burn-in test, the KGD is once mounted in a special carrier, and the carrier with the KGD mounted is further mounted in an IC socket. Subsequently, the IC socket is incorporated into a test board, to carry out a burn-in test.

The structure of the conventional carrier with the KGD mounted will be simply described with reference to FIG. 4. This figure is a sectional view of a carrier with an IC chip mounted.

The KGD carrier 10 comprises a carrier retaining member 20 and a carrier base assembly 30.

The carrier retaining member 20 has a cover 21, a chip retaining member 22, a coil spring 23, and a steel ball 24 to elastically hold an IC chip 40 placed on the carrier base assembly 30.

The carrier base assembly 30 has a carrier main body 31 including a latch 36, a substrate (contact sheet) 32 as a printed-circuit board, an elastomer frame 33, an elastomer 34 as a cushion, and a carrier base 35. The latch 36 has a locking portion 36a locked on the carrier retaining member 20 and a latch base 36b rotationally movably mounted on the carrier main body 31 and urged and biased toward the interior of the carrier base assembly 30 by a helical torsion coil spring 37.

The IC chip 40 is mounted in the carrier 10 in the following manner. First, with the carrier retaining member 20 removed, the IC chip 40 is placed on the substrate 32. Subsequently, the carrier retaining member 20 is used to uniformly and elastically push the IC chip 40 into tight contact with the substrate 32, thereby electrically connecting the IC chip 40 and the substrate 32 together. Furthermore, the latch 36 is engaged with the cover 21 of the carrier retaining member 20 to complete mounting the IC chip 40 as shown in the figure.

As shown in FIG. 4, at least two opposite latches 36 are required to engage the carrier retaining member 20 with the carrier base assembly 30 and also to uniformly tightly contact the IC chip 40 with the substrate 32. However, in the conventional carrier 10, the at least two opposite latches 36 are provided with the carrier main body 31. With this arrangement, when the carrier retaining member 20 is removed from the carrier base assembly 30, the two opposite latches 36 must be simultaneously rotationally moved outward in the opposite directions relating to the carrier retaining member 20. That is, the two opposite latches 36 must be simultaneously opened and disengaged (unlocked) from the carrier retaining member 20. Then, while maintaining this disengaged state, the carrier retaining member 20 must be removed from the carrier base assembly 30. Conversely, when the carrier retaining member 20 is installed on the carrier base assembly 30, this installation must be carrier out while keeping the two opposite latches 36 open.

A complicated structure is required to automatically install and remove the carrier retaining member 20 on and from the carrier base assembly 30 while keeping the at least two opposite latches 36 simultaneously open. If this is manually carried out, the operation is difficult. Furthermore, if for example, two sets of two opposite latches 36 are provided so as to cross at right angles, the complicity and difficulty enhance.

In view of these problems, it is an object of the present invention to provide a latch locking mechanism of a KGD carrier which has a simple structure and which facilitates the simultaneous opening and closing of latches and the installation and removal of a carrier retaining member.

SUMMARY OF THE INVENTION

To attain this object, a latch locking mechanism of a KGD carrier according to the present invention comprises a carrier retaining member having a cover and a chip retaining member, a carrier base assembly having a carrier main body, a substrate, and a carrier base, at least two opposite latches rotationally movably provided on a cover of the carrier retaining member and each including an operation portion and a locking portion which generally form an L shape, and engaging portions provided on the carrier main body of the carrier base assembly to engage with the corresponding locking portions of the latches. The latch locking mechanism is characterized in that when the locking portions of the two opposite latches are closed, the locking portions engage with the corresponding engaging portions provided on the carrier main body to lock the carrier retaining member and the carrier base assembly.

Further, each tip of the operation portions of the two opposite latches are preferably arranged close to each other with a small space.

Furthermore, two sets of the two opposite latches may be arranged so as to cross at right angles.

Moreover, at least two sets of the two opposite latches may be arranged so that the sets are parallel with each other and the operating portions of the sets are connected together.

Further, in the latch locking mechanism of a KGD carrier according to the present invention, the cover may have a groove portion which is formed of inclined surfaces having an inclination α from a horizontal surface and a concave portion so as to allow the operation portions of the two opposite latches to be rotationally moved.

Furthermore, the angle α and an angle β at which the locking portion of the latch can be cleared from the engaging portion of the carrier preferably has a relationship α−β=−1 to +3°, more preferably a relationship α−β=0 to +3°.

The above and other objects, effects, features and advantages of the present invention will become more apparent from the following description of embodiments thereof taken in conjunction with the accompanying drawings.

BRIEF DESCRIPTION OF THE DRAWINGS

FIGS. 1A, 1B, and 1C show a carrier according to the present invention, wherein FIG. 1A is a sectional view of the carrier in which an IC chip is mounted and in which latches are locked, FIG. 1B is a sectional view of the carrier in which the latches are unlocked, and FIG. 1C is a partly enlarged top view of a latch operating portion in FIG. 1A;

DETAILED DESCRIPTION OF PREFERRED EMBODIMENTS

Embodiments of the present invention will be described with reference to FIGS. 1a to 3.

Figure 1A:
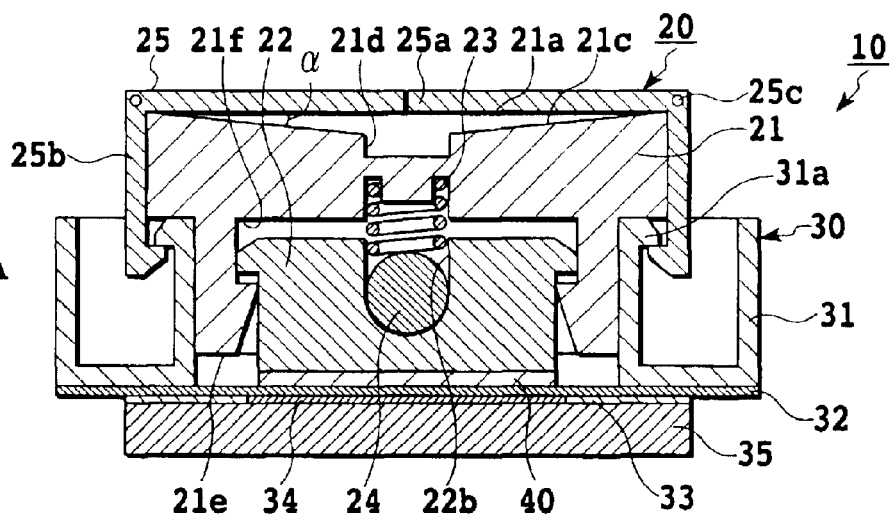
Figure 1B:
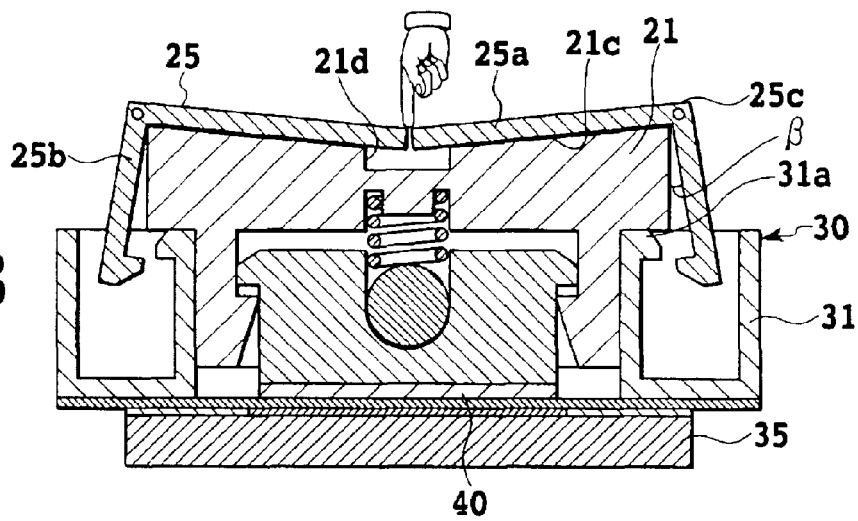
Figure 1C:
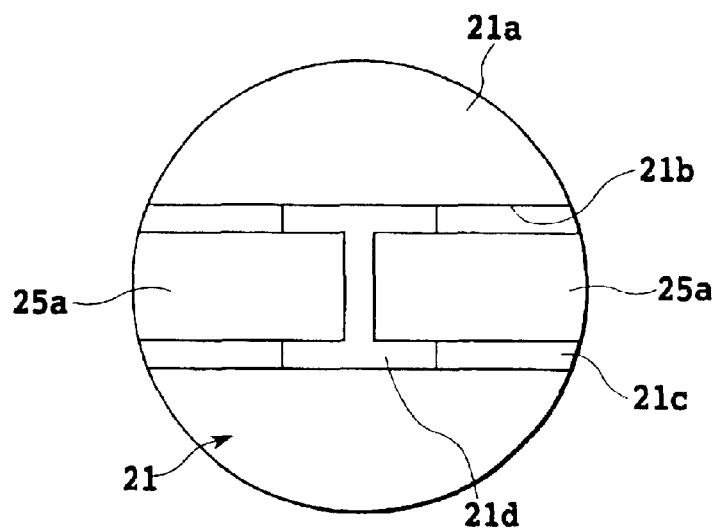
Figure 2:
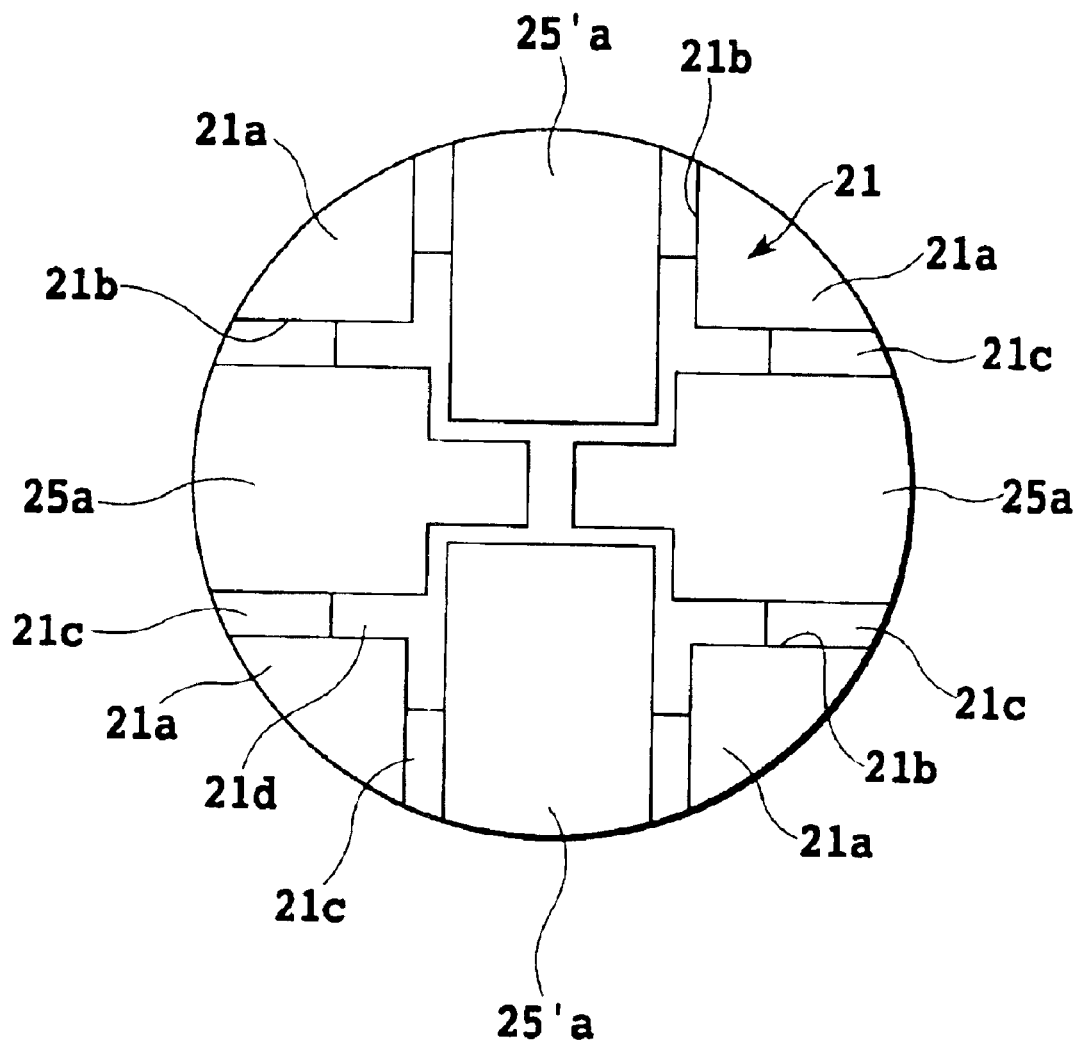
FIG. 2 is a partly enlarged top view similar to FIG. 1C, showing an embodiment of another latch operating portion.
Figure 3:
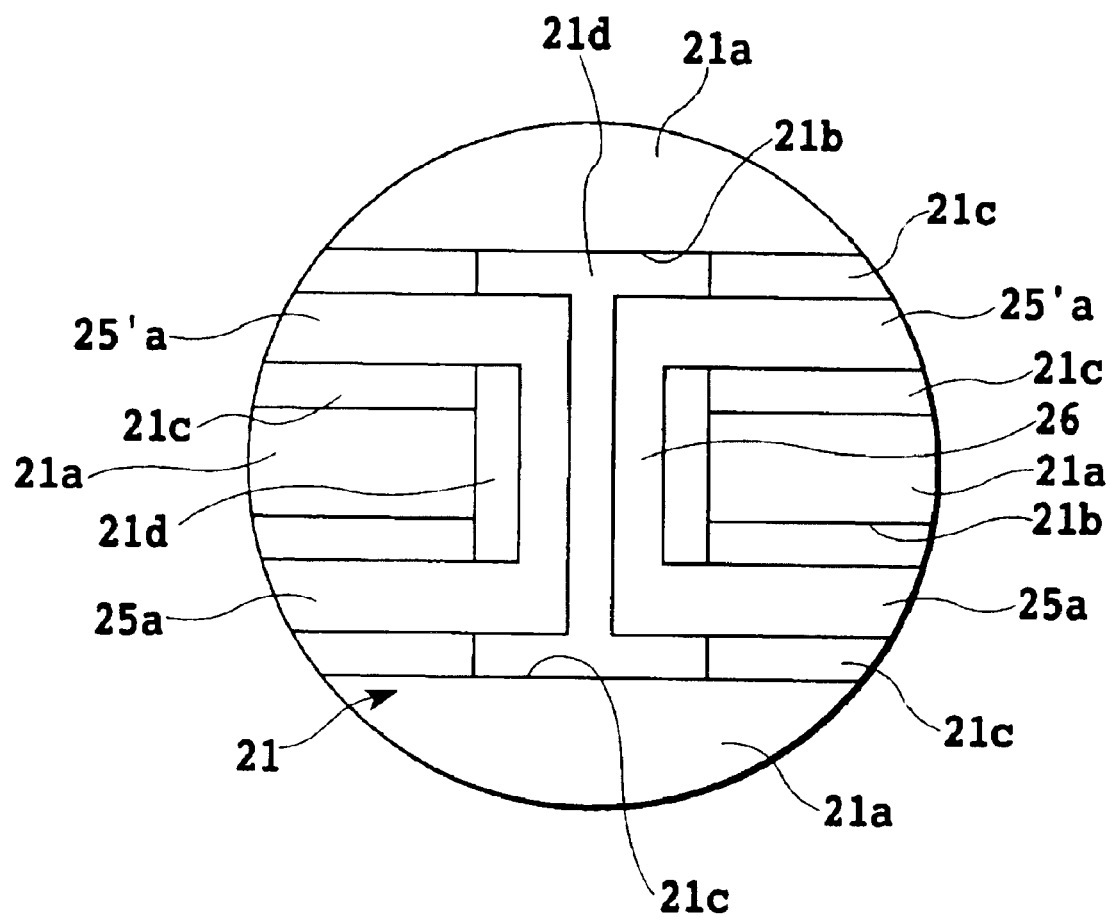
FIG. 3 is a partly enlarged top view similar to FIG. 1C, showing an embodiment of yet another latch operating portion.
Figure 4:
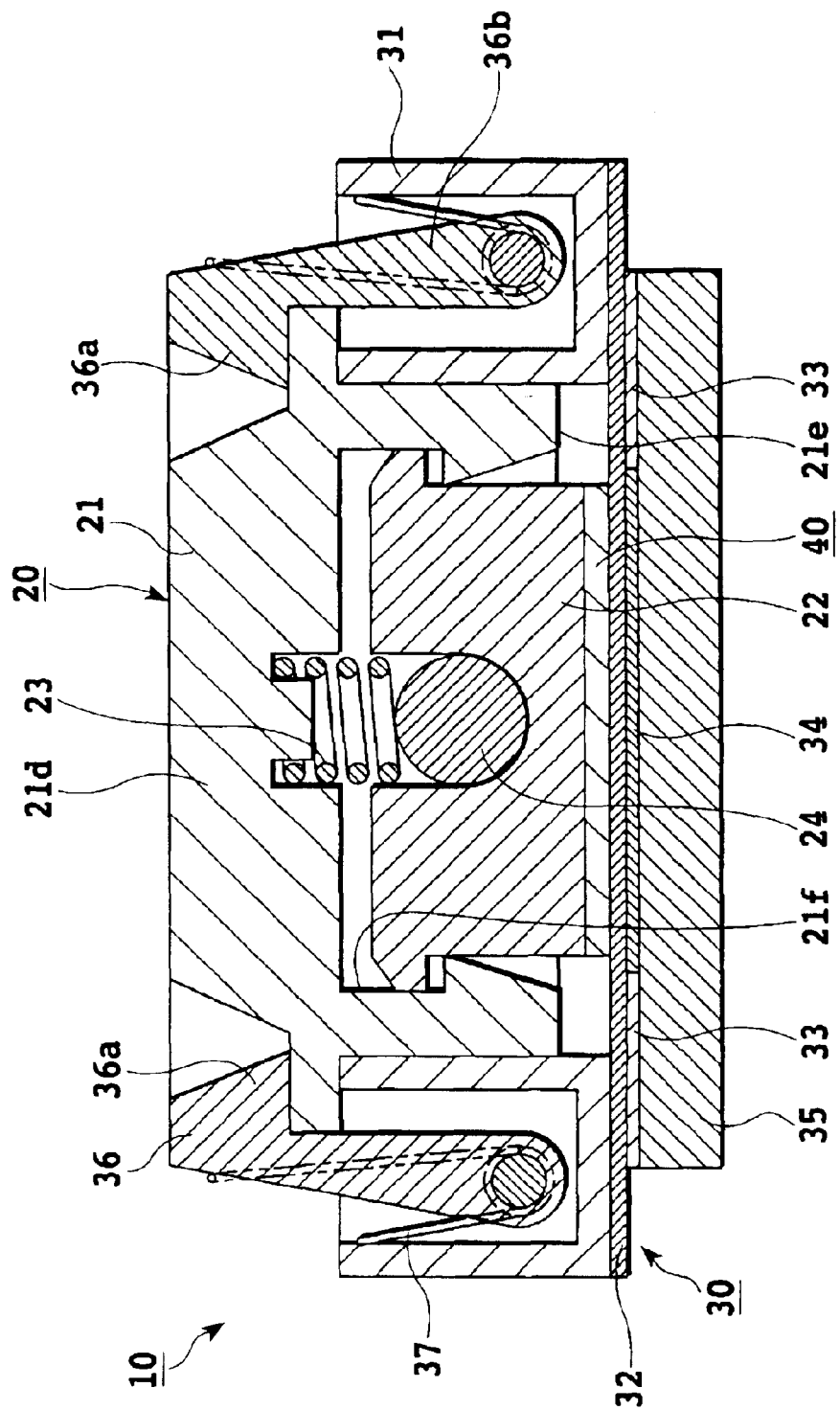
FIG. 4 is a sectional view of a conventional carrier with an IC chip mounted.

FIGS. 1A, 1B, and 1C show a carrier according to the present invention. FIG. 1A is a sectional view of the carrier in which an IC chip similar to that in FIG. 4, showing a conventional example, is placed and in which latches are locked. FIG. 1B is a sectional view of the carrier in which the latches are unlocked. FIG. 1C is a partly enlarged top view of a latch operating portion in FIG. 1A. FIGS. 2 and 3 are partly enlarged top view similar to FIG. 1C, showing embodiments of other latch operating portions. The same reference numbers as those in the conventional example denote substantially the same parts.

As shown in FIG. 1A, the KGD carrier 10 according to the present invention is comprised of a carrier retaining member 20 and a carrier base assembly 30 as in the case with the conventional example.

The carrier retaining member 20 has a cover 21, a chip retaining member 22, a coil spring 23, a steel ball 24, and latches 25.

The cover 21 has a groove portion 21b formed on its top surface 21a and formed of a central concave portion 21d and an inclined surface 21c having an inclination α from a horizontal surface so as to allow operating portions 25a of two opposite latches 25 to be rotationally moved. The inclination α of the inclined surface 21c is set to be equal to or slightly (2 to 3°) larger than an angle β at which the latch 25 and the carrier base assembly 30 are disengaged (unlocked) from each other.

This relationship between α and β allows the operation portions 25a of the latches 25 to be rotationally moved smoothly. In other words, if the angle β is larger than the angle α, the amount of rotational movement of the operation portions 25a of the latches 25 is excessively small. This hinders the latches from being simultaneously opened and closed smoothly. On the other hand, if the angle α is excessively larger than the angle β (this means that the angle α is larger than the angle β by 3°), the amount of rotational movement of the operation portions 25a of the latches 25 is excessively large. Thus, if the operation portions 25a are rotationally moved, locking portions 25b collide against a carrier main body 31 to damage it. In experiments conducted by the inventor, no problems occurred when α-β=0 to 3°. Even when "β-α" was larger than 0 and equal to or smaller than 1, the required amount of rotational movement of the operation portions 25a of the latches 25 was obtained. It has thus been confirmed that this relationship creates also no practical problems with the simultaneous opening and closing of the latch. Consequently, there are no practical problems provided that α-β=-1 to 3°. For perfection, α-β is desirably 0 to 3°.

Further, a bottom concave portion 21f is formed in a bottom surface 21e of the cover to accommodate the chip retaining member 22.

The chip retaining member 22 is vertically movably accommodated in the bottom concave portion 21f of the cover 21 via a coil spring 23 that urges and biases the chip retaining member 22 downward and a steel ball 24 that enables the chip retaining member 22 to be slightly swung to uniformly push the IC chip 40 against the substrate 32. A locking mechanism is provided between the chip retaining member 22 and the bottom concave portion 21f of the cover 21 to prevent the chip retaining member 22 from slipping out of the bottom concave portion of the cover 21. Further, the steel ball 24 is fitted in a top concave portion 22b of the chip retaining member 22 so as to contact with the other end of the coil spring 23.

Two latches 25 (one pair) are provided opposite each other and along the top surface and sides of the cover 21 as shown in the figure. Each of the latches 25 is generally L shaped and has the operation portion 25a extending horizontally inward along the top surface of the cover 21 and the locking portion 25b extending vertically downward along the sides of the cover 21 perpendicular to the operation portion 25a. The latches 25 are rotationally movably supported on the cover 21 at theirs corners 25c. Further, each of the operation portions 25a is urged and biased upward (for the locking portion 25b, inward) by a helical torsion coil spring, a plate spring (not shown), or the like. Each of the locking portions 25b has a tip portion shaped like a hook and engages with a similarly hook-shaped engaging portion 31a of the carrier base assembly 30, described later. The locking portions 25a thus lock the carrier base assembly 30 and the carrier retaining member 20 with the engaging portion 31a.

Furthermore, the two opposite latches 25 are arranged close to each other so that the ends of the operations portions 25a of the latches 25 abut against each other near a central portion of the cover 21 with a small space of, for example, about several mm size (see FIG. 1C). With the two opposite latches 25 configured in this manner, when the ends of the two opposite operation portions 25a are pushed downward, for example, with one finger, the locking portions 25b are correspondingly opened, as shown in FIG. 1B. Accordingly, the two latches 25 and the carrier base assembly 30 are simultaneously and easily unlocked.

The carrier base assembly 30 has a carrier main body 31, a substrate (contact sheet) 32 as a printed-circuit board, an elastomer frame 33, an elastomer 34 as a cushion, and a carrier base 35. The substrate 32 is stuck to the carrier main body 31 and integrated with it together with other members using countersunk screws (not shown) and the like, to form the carrier base assembly 30. The carrier main body 31 has the hook-shaped engaging portions 31a formed in position which engage with the corresponding locking portions 25b of the latches 25 to lock the carrier retaining member 20 and the carrier base assembly 30. The engaging portions 31a constitute a latch lock mechanism.

Description will be given below of operations of installing and removing the IC chip 40 in and from the carrier 10 configured as described above.

First, the mounting of the IC chip 40 in the carrier 10 will be described. The IC chip 40 is positioned and placed on the substrate 32 of the carrier base assembly 30 from which the carrier retaining member 20 has been removed. Then, an operator's finger or the like is used to push downward the ends of the operation portions 25a of the two opposite latches 25 provided on the cover 21 of the carrier retaining member 20. Thus, the locking portions 25b of the latches 25 are opened. Then, the cover 21 is fitted into the carrier base assembly 30 to push the IC chip 40 so as to sandwich it between the chip retaining member 22 and the substrate 32. At this time, the push-down force of the finger is removed to engage the locking portions 25b of the latches 25 with the corresponding engaging portions 31a of the carrier main body 31. Thus, the carrier retaining member 20 is locked on the carrier base assembly 30 to complete mounting the IC chip 40.

The carrier 10 with the IC chip 40 mounted is mounted in an IC socket (not shown). The IC socket is further incorporated into a test board (not shown), which is then subjected to a burn-in test.

Next, to remove the IC chip 40 from the carrier 10, the operator's finger or the like is used to push downward the ends of the operation portions 25a of the two opposite latches 25 provided on the cover 21 of the carrier retaining member 20. Thus, the locking portions 25b of the latches 25 are opened to unlock the carrier retaining member 20 and the carrier base assembly 30. With the locking portions 25b open, the carrier retaining member 20 is removed from the carrier base assembly 30 to allow the IC chip 40 to be removed.

In the above embodiment, one set of two opposite latches 25 has been described. However, the present invention is not limited to this aspect. Two or more sets of two opposite latches 25 may be provided. For example, if two sets of two opposite latches 25 are provided, the sets may be provided so as to cross at right angles as shown in FIG. 2 or may be provided parallel with each other as shown in FIG. 3. Then, if the two sets of latches cross at right angles, both shoulders of tips of either the operation portions 25a or 25'a (in the figure, 25a) are preferably cut off so as to locate the other operation portions 25'a closer to each other as shown in FIG. 2. Thereby, it enables to push in all operation portions 25a and 25'a with one finger or the like. Further, if the two sets are parallel with each other, a pair of operation portions 25a and 25'a located on the same side preferably has their tips connected together using a connector 26 as shown in FIG. 3.

Further, the present invention has been described in conjunction with the latch locking mechanism of the KGD carrier. However, the present invention is applicable to, for example, a mechanism that locks a retaining member or a radiating sink tank in an open top type IC socket in which an IC package such as a BGA is mounted.

As described above, the latch lock mechanism of the KGD carrier of the present invention has a simple structure in which latches are provided on a carrier retaining member. This facilitates the simultaneous opening and closing of the latches and the installation and removal of the carrier retaining member, thus allowing an IC chip to be promptly installed and removed.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A latch locking mechanism of a KGD carrier, comprising:
   a carrier retaining member having a cover and a chip retaining member;
   a carrier base assembly having a carrier main body, a substrate, and a carrier base;
   at least two opposite latches rotationally movably provided on a cover of said carrier retaining member and each including an operation portion and a locking portion which generally form an L shape; and
   engaging portions provided on the carrier main body of said carrier base assembly to engage with the corresponding locking portions of the latches,
   wherein when the locking portions of the two opposite latches are closed, the locking portions engage with the corresponding engaging portions provided on the carrier main body to lock the carrier retaining member and the carrier base assembly.

2. A latch locking mechanism of a KGD carrier as claimed in claim 1, wherein each tip of the operation portions of said two opposite latches is arranged close to each other with a small space.

3. A latch locking mechanism of a KGD carrier as claimed in claim 1, wherein two sets of said two opposite latches are arranged so as to cross at right angles.

4. A latch locking mechanism of a KGD carrier as claimed in claim 1, wherein at least two sets of said two opposite latches are arranged so that the sets are parallel with each other and the operating portions of the sets are connected together.

5. A latch locking mechanism of a KGD carrier, comprising:
   a carrier retaining member having a cover and a chip retaining member;
   a carrier base assembly having a carrier main body, a substrate, and a carrier base;
   at least two opposite latches rotationally movably provided on the cover of the carrier retaining member and each including an operation portion and a locking portion which generally form an L shape; and
   engaging portions provided on the carrier main body of the carrier base assembly to engage with the corresponding locking portions of said latches, and
   wherein when the locking portions of the two opposite latches are closed, the locking portions engage with the corresponding engaging portions provided on the carrier main body to lock said carrier retaining member and said carrier base assembly, and
   wherein the cover has a groove portion which is formed of inclined surfaces having an inclination $\alpha$ from a horizontal surface and a concave portion so as to allow the operation portions of the two opposite latches to be rotationally moved.

6. A latch locking mechanism of a KGD carrier as claimed in claim 5, wherein the angle $\alpha$ and an angle $\beta$ at which the locking portion of the latch can be cleared from the engaging portion of the carrier have a relationship $\alpha-\beta=-1$ to $+3°$.

7. A latch locking mechanism of a KGD carrier as claimed in claim 5, wherein said angle $\alpha$ and an angle $\beta$ at which the locking portion of the latch can be cleared from the engaging portion of the carrier have a relationship $\alpha-\beta=0$ to $+3°$.

8. A latch locking mechanism of a KGD carrier as claimed in claim 5, wherein each tip of the operation portions of said two opposite latches are arranged close to each other with a small space.

9. A latch locking mechanism of a KGD carrier as claimed in claim 5, wherein two sets of said two opposite latches are arranged so as to cross at right angles.

10. A latch locking mechanism of a KGD carrier as claimed in claim 5, wherein at least two sets of said two opposite latches are arranged so that the sets are parallel with each other and the operating portions of the sets are connected together.

* * * * *